(12) United States Patent
Butler

(10) Patent No.: US 10,485,340 B1
(45) Date of Patent: Nov. 26, 2019

(54) MEDIA SYSTEM STAND

(71) Applicant: Vincent Butler, Detroit, MI (US)

(72) Inventor: Vincent Butler, Detroit, MI (US)

( * ) Notice: Subject to any disclaimer, the term of this patent is extended or adjusted under 35 U.S.C. 154(b) by 0 days.

(21) Appl. No.: 16/167,709

(22) Filed: Oct. 23, 2018

(51) Int. Cl.
*A47B 81/06* (2006.01)
*H05K 5/02* (2006.01)
*H05K 5/00* (2006.01)
*H02G 15/08* (2006.01)

(52) U.S. Cl.
CPC .......... *A47B 81/065* (2013.01); *A47B 81/064* (2013.01); *H02G 15/085* (2013.01); *H05K 5/0017* (2013.01); *H05K 5/0021* (2013.01); *H05K 5/0234* (2013.01); *H05K 5/0247* (2013.01)

(58) Field of Classification Search
CPC .. A47B 81/064; A47B 81/065; H02G 15/085; H05K 5/0017; H05K 5/0021; H05K 5/0234; H05K 5/0247

USPC .................................................. 174/71 C
See application file for complete search history.

(56) References Cited

U.S. PATENT DOCUMENTS

| 6,554,238 B1 | 4/2003 | Hibberd |
| 7,118,080 B2 | 10/2006 | Chann |
| 7,261,261 B2 | 8/2007 | Ligertwood |
| D643,027 S | 8/2011 | Calco |
| 9,549,609 B2 | 1/2017 | Constantino |
| 2013/0306580 A1 | 11/2013 | Chen |

FOREIGN PATENT DOCUMENTS

WO    WO2004104472    12/2004

*Primary Examiner* — Tremesha S Willis

(57) ABSTRACT

A media system stand for supporting up to three displays includes a frame, a base, and a plurality of panel brackets. The base is coupled to a bottom of the frame and is configured to position on a substantially horizontal surface so that the frame is substantially perpendicular to the substantially horizontal surface. The panel brackets are coupled to the frame and each panel bracket is configured to couple to a respective display so that the respective display is coupled to the frame. The panel brackets are configured to position the displays for viewing.

1 Claim, 6 Drawing Sheets

MEDIA SYSTEM STAND

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION (1) Field of the Invention (2) Description of Related Art Including Information Disclosed Under 37 CFR 1.97 and 1.98

The disclosure and prior art relate to stands and more particularly pertains to a new stand for supporting up to three displays.

BRIEF SUMMARY OF THE INVENTION

An embodiment of the disclosure meets the needs presented above by generally comprising a frame, a base, and a plurality of panel brackets. The base is coupled to a bottom of the frame and is configured to position on a substantially horizontal surface so that the frame is substantially perpendicular to the substantially horizontal surface. The panel brackets are coupled to the frame and each panel bracket is configured to couple to a respective display so that the respective display is coupled to the frame. The panel brackets are configured to position the displays for viewing.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
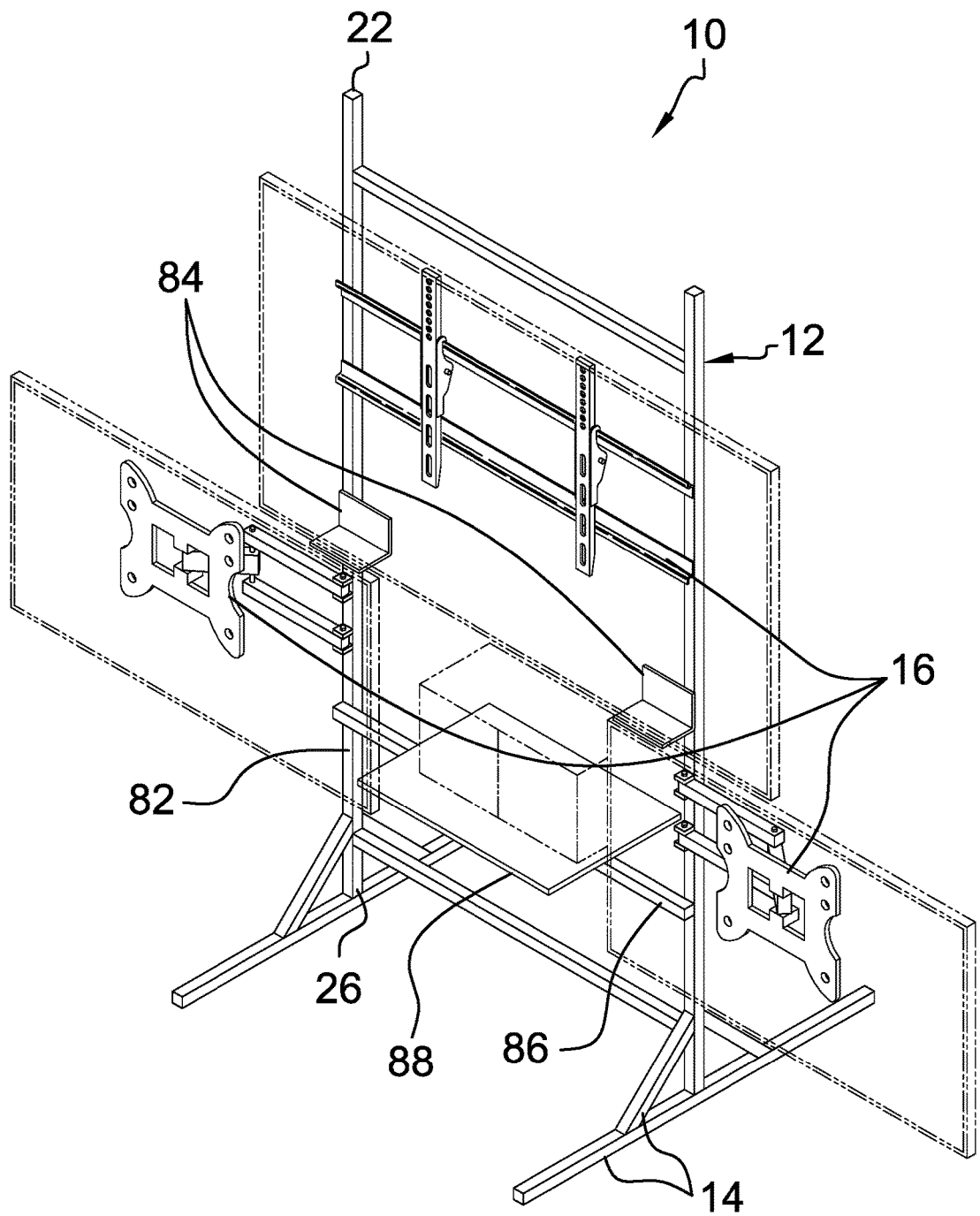
FIG. 1 is an isometric perspective view of a media system stand according to an embodiment of the disclosure.

With reference now to the drawings, and in particular to FIGS. 1 through 6 thereof, a new stand embodying the principles and concepts of an embodiment of the disclosure and generally designated by the reference numeral 10 will be described.

As best illustrated in FIGS. 1 through 6, the media system stand 10 generally comprises a frame 12, a base 14, and a plurality of panel brackets 16. The frame 12 comprises a pair of sidebars 18. An upper crossbar 20 is coupled to and extends between the sidebars 18 proximate to a top 22 of the frame 12. A lower crossbar 24 is coupled to and extends between the sidebars 18 proximate to a bottom 26 of the frame 12.

Figure 4:
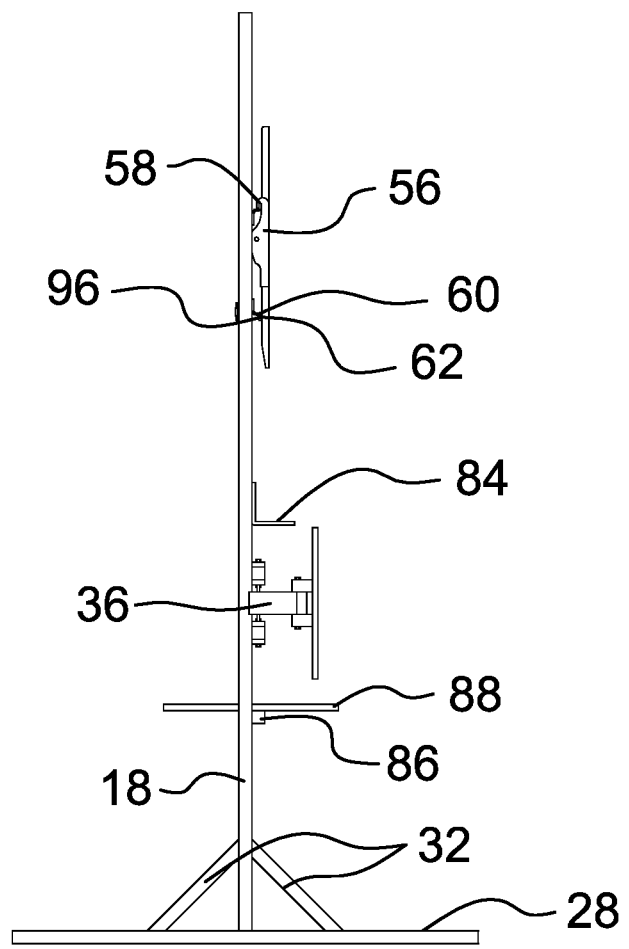
FIG. 4 is a side view of an embodiment of the disclosure.
Figure 5:
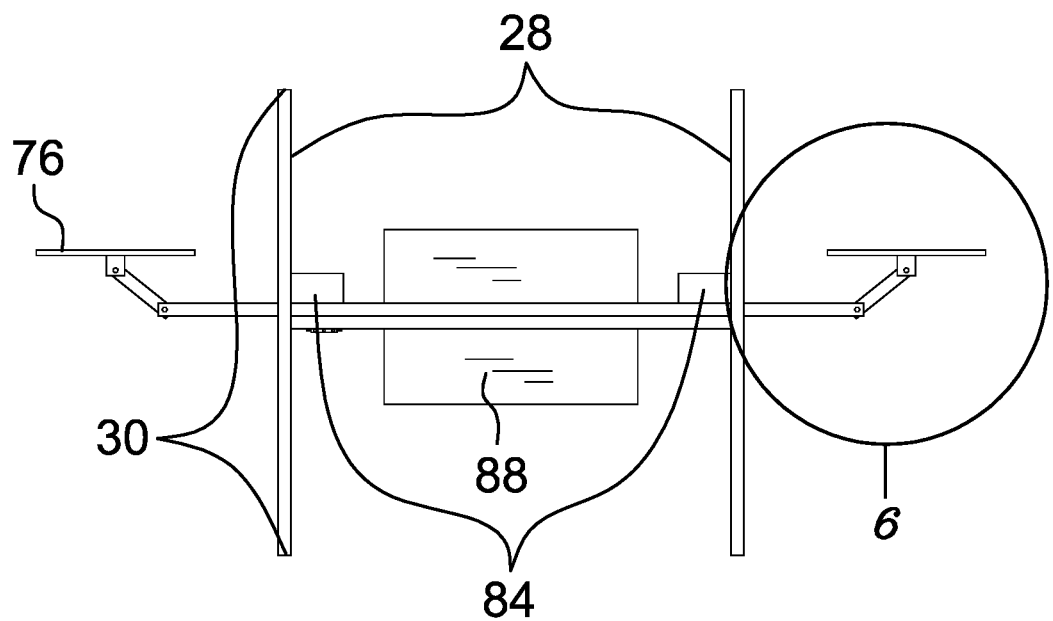
FIG. 5 is a bottom view of an embodiment of the disclosure.

The base 14 is coupled to the bottom 26 of the frame 12 and is configured to position on a substantially horizontal surface so that the frame 12 is substantially perpendicular to the substantially horizontal surface. The base 14 comprises a pair of first bars 28. Each sidebar 18 is coupled to and extends perpendicularly from a respective first bar 28 so that the first bar 28 is perpendicular to the frame 12. The sidebar 18 is positioned substantially equally distant from opposing ends 30 of the respective first bar 28. Each of a set of four second bars 32 is coupled to and extends angularly between a respective first bar 28 and an associated sidebar 18, as shown in FIG. 4. The set of four second bars 32 is positioned to brace the frame 12 relative to the first bars 28.

The plurality of panel brackets 16 is coupled to the frame 12. Each panel bracket 16 is configured to couple to a respective display, such as a flat or curved panel television display, so that the respective display is coupled to the frame 12. The panel brackets 16 are configured to position the displays for viewing. While the stand 10 can be used to position displays for viewing in any environment, it is particularly suitable for outdoor use.

The plurality of panel brackets 16 comprises a center bracket 34 and a pair of side brackets 36. The center bracket 34 is coupled to and extends between the pair of sidebars 18 proximate to the top 22 of the frame 12. The center bracket 34 is configured to couple to a center display so that the center display is substantially centered between the sidebars 18. Each side bracket 36 is pivotally coupled to and extends from a respective sidebar 18. The side bracket 36 is configured to couple to a respective side display so that the respective side display is selectively positionable relative to the respective sidebar 18 and a front 82 of the frame 12.

The center bracket 34 comprises an upper crossmember 38, a lower crossmember 40, and a pair of vertical members 42. The upper crossmember 38 is coupled to and extends between the sidebars 18 proximate to the top 22 of the frame 12. The upper crossmember 38 is L-shaped when viewed longitudinally. An upper lip 44 is coupled to the upper crossmember 38 and extends toward the top 22 of the frame 12.

The lower crossmember 40 is coupled to and extends between the sidebars 18 so that the lower crossmember 40 is positioned between the upper crossmember 38 and the side brackets 36. The lower crossmember 40 is L-shaped when viewed longitudinally. A lower lip 46 is coupled to the lower crossmember 40 and extends toward the bottom 26 of the frame 12.

Each vertical member 42 is slidably coupled to the upper crossmember 38 and is selectively couplable to the lower crossmember 40. Each of two sets of holes 48 is positioned in a respective vertical member 42 proximate to an upper end 50 of the respective vertical member 42. Each of two sets of slots 52 is positioned in a respective vertical member 42 proximate to a lower end 54 of the respective vertical member 42. Respective holes 48 and respective slots 52 are selectively alignable with a set of four threaded holes that is positioned in the center display. Each of the respective holes 48 and each of the respective slots 52 is configured to insert a respective bolt, positioning the respective bolt to be threaded into a corresponding threaded hole to couple the center display to the vertical members 42. The slots 52 and the holes 48 allow the vertical members 42 to be coupled to center displays that have sets of four threaded holes having a variety of spacings.

Each of a pair of hook brackets 56 is pivotally coupled to a respective vertical member 42. The hook bracket 56 is positioned to selectively insert the upper lip 44 into a gap 58 of the hook bracket 56 to couple the respective vertical member 42 to the upper crossmember 38. The pair of hook brackets 56 is positioned to selectively pivot relative to the frame 12 to tilt the center display.

Each of pair of tabs 60 is coupled to and extends from a respective vertical member 42 proximate to the lower end 54 of the vertical member 42. Each of pair of orifices 96 is positioned in a respective tab 60. Each of pair of set screws 62, which are complementary to the orifices 96, is positioned to threadedly insert into a respective orifice 96 so that the set screw 62 extends through the respective tab 60 and past the lower lip 46 to frictionally couple to the lower crossmember 40 so that the respective vertical member 42 is coupled to the lower crossmember 40.

Each side bracket 36 comprises a pair of first arms 64 and a second arm 66. The pair of first arms 64 is pivotally coupled to and extends from a respective sidebar 18 to define a first pivot point 68. A first axle 70 is rotationally coupled to and extends between the first arms 64 distal from the respective sidebar 18 to define a second pivot point 72.

Figure 6:
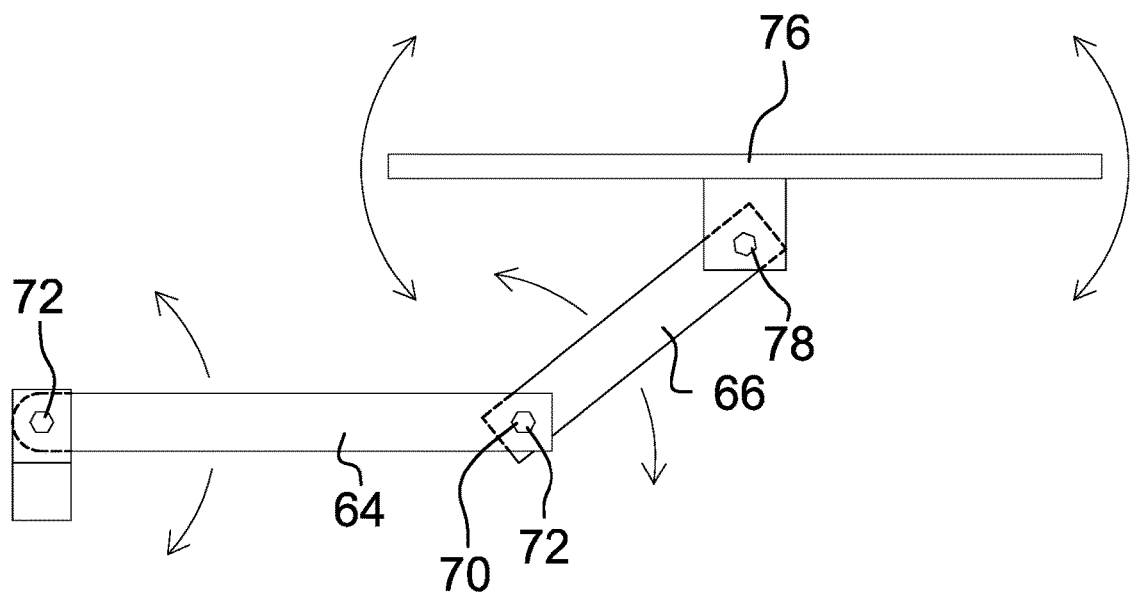
FIG. 6 is a detail view of an embodiment of the disclosure.

The second arm 66 is coupled to and extends from the first axle 70. A second axle 74 is coupled to the second arm 66 distal from the first axle 70. A mounting plate 76 is rotationally coupled to the second axle 74 to define a third pivot point 78. A plurality of mounting holes 80 is positioned in the mounting plate 76. Respective mounting holes 80 are configured to selectively align with a set of four threaded holes that is positioned in a respective side display. Each of the respective mounting holes 80 is configured to insert a bolt, positioning the bolt to be threaded into a corresponding threaded hole to couple the respective side display to the mounting plate 76. The first pivot point 68, the second pivot point 72, and the third pivot point 78 are configured to allow selective positioning of the respective side display relative to the respective sidebar 18 and a front 82 of the frame 12, as shown in FIG. 6.

Figure 2:
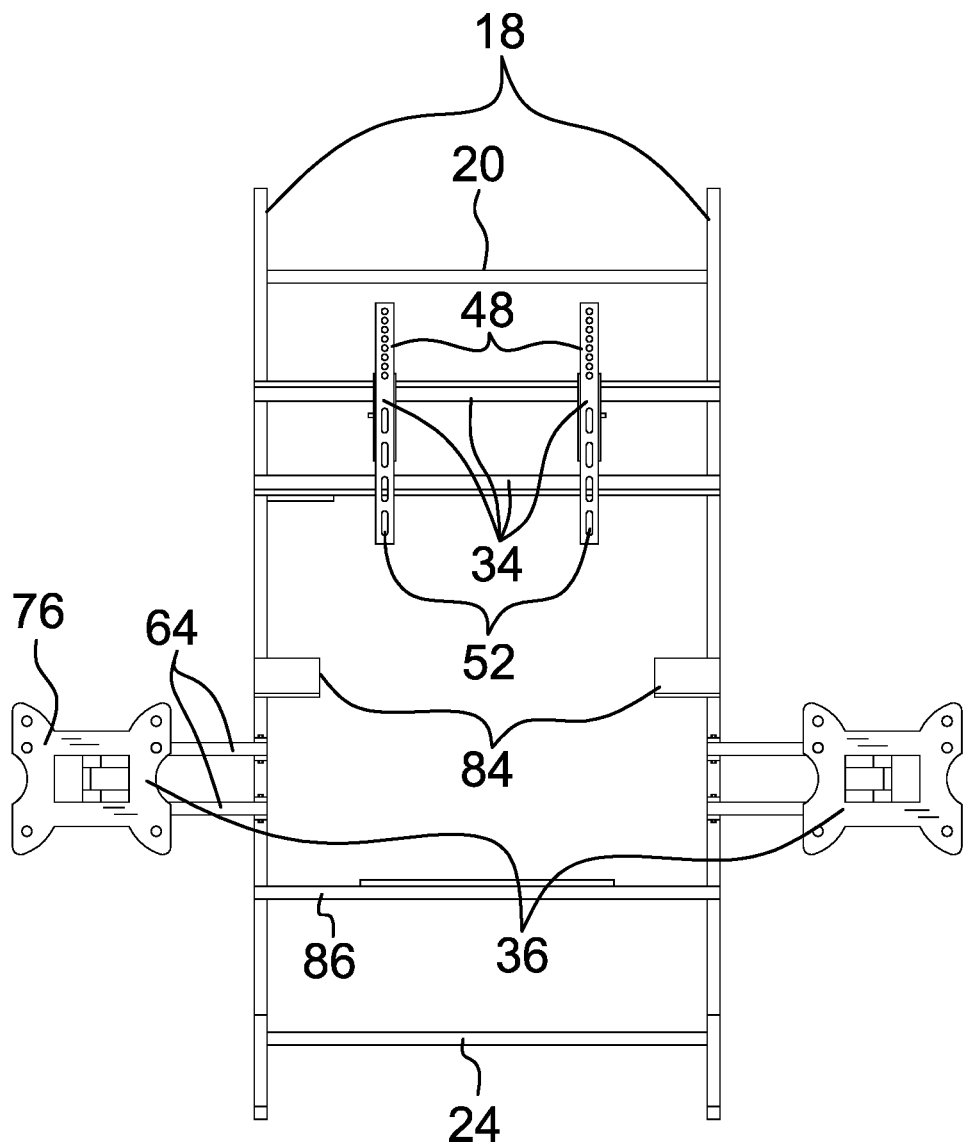
FIG. 2 is a front view of an embodiment of the disclosure.
Figure 3:
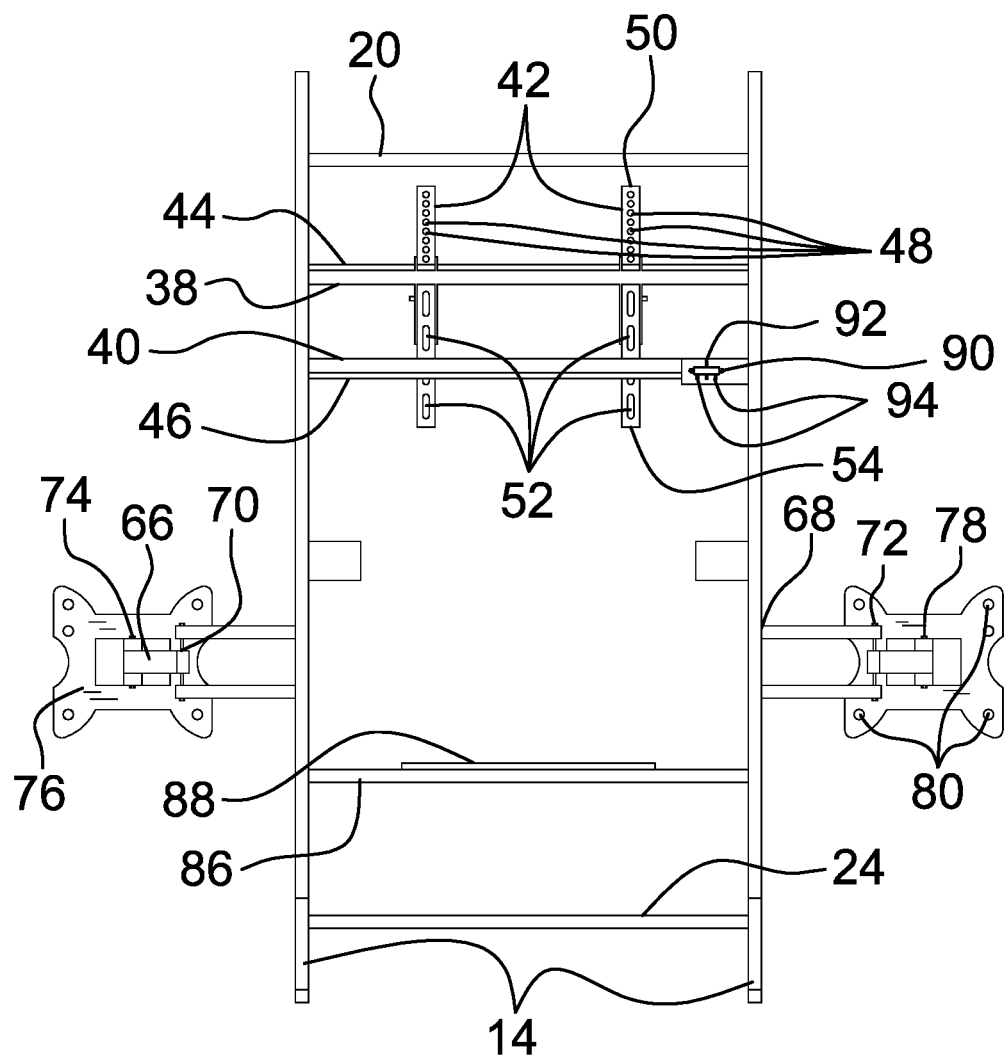
FIG. 3 is a rear view of an embodiment of the disclosure.

Each of pair of L-brackets 84 is coupled to a respective sidebar 18 between the center bracket 34 and an associated side bracket 36, as shown in FIG. 2. The pair of L-brackets 84 is configured to position a soundbar.

A rod 86 is coupled to and extends between the pair of sidebars 18. The rod 86 is positioned on the sidebars 18 between the pair of side brackets 36 and the lower crossbar 24. A plate 88 is coupled to and extends bidirectionally from the rod 86 so that the plate 88 is substantially parallel to the substantially horizontal surface, as shown in FIG. 2. The plate 88 is configured to position a component of a media system.

A coaxial cable splitter 90 is coupled to the frame 12. The coaxial cable splitter 90 comprises a coaxial cable input 92 and a plurality of coaxial cable outputs 94. The coaxial cable input 92 is configured to couple to a coaxial cable, positioning the plurality of coaxial cable outputs 94 to provide signal to the center display and the side displays. The plurality of coaxial cable outputs 94 comprises three coaxial cable outputs 94.

In use, the base 14 is positioned on the substantially horizontal surface so that the frame 12 is substantially perpendicular to the substantially horizontal surface. The center display and two side displays are coupled to the center bracket 34 and the side brackets 36, respectively. The coaxial cable input 92 is configured to couple to the coaxial cable, with the three coaxial cable outputs 94 providing the signal to the center display and the two side displays.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be only one of the elements.

I claim:
1. A media system stand comprising:
   a frame, the frame comprising:
     a pair of sidebars,
     an upper crossbar, the upper crossbar being coupled to and extending between the sidebars proximate to a top of the frame, and
     a lower crossbar, the lower crossbar being coupled to and extending between the sidebars proximate to a bottom of the frame;
   a base coupled to the bottom of the frame wherein the base is configured for positioning on a substantially horizontal surface such that the frame is substantially perpendicular to the substantially horizontal surface, the base comprising:
  a pair of first bars, each sidebar being coupled to and extending perpendicularly from a respective first bar such that the first bar is perpendicular to the frame, the sidebar being positioned substantially equally distant from opposing ends of the respective first bar, and
  a set of four second bars, each second bar being coupled to and extending angularly between a respective first bar and an associated sidebar wherein the set of four second bars is positioned for bracing the frame relative to the first bars;
a plurality of panel brackets coupled to the frame, each panel bracket being configured for coupling to a respective display such that the respective display is coupled to the frame wherein the panel brackets are configured for positioning the displays for viewing, the plurality of panel brackets comprising a center bracket and a pair of side brackets, the center bracket being coupled to and extending between the pair of sidebars proximate to the top of the frame wherein the center bracket is configured for coupling to a center display such that the center display is substantially centered between the sidebars, each side bracket being pivotally coupled to and extending from a respective sidebar wherein the side bracket is configured for coupling to a respective side display such that the respective side display is selectively positionable relative to the respective sidebar and a front of the frame, the center bracket comprising:
  an upper crossmember coupled to and extending between the sidebars proximate to the top of the frame, the upper crossmember being L-shaped when viewed longitudinally,
  an upper lip coupled to the upper crossmember, the upper lip extending toward the top of the frame,
  a lower crossmember coupled to and extending between the sidebars such that the lower crossmember is positioned between the upper crossmember and the side brackets, the lower crossmember being L-shaped when viewed longitudinally,
  a lower lip coupled to the lower crossmember, the lower lip extending toward the bottom of the frame,
  a pair of vertical members, each vertical member being slidably coupled to the upper crossmember and selectively couplable to the lower crossmember,
  two sets of holes, each set of holes being positioned in a respective vertical member proximate to an upper end of the respective vertical member,
  two sets of slots, each set of slots being positioned in a respective vertical member proximate to a lower end of the respective vertical member wherein respective holes and respective slots are selectively alignable with a set of four threaded holes positioned in the center display wherein each of the respective holes and each of the respective slots is configured for inserting a respective bolt positioning the respective bolt for threading into a corresponding threaded hole for coupling the center display to the vertical members,
  a pair of hook brackets, each hook bracket being pivotally coupled to a respective vertical member wherein the hook bracket is positioned for selectively inserting the upper lip into a gap of the hook bracket for coupling the respective vertical member to the upper crossmember wherein the pair of hook brackets is positioned for selectively pivoting relative to the frame for tilting the center display,
  a pair of tabs, each tab being coupled to and extending from a respective vertical member proximate to the lower end of the vertical member,
  a pair of orifices, each orifice being positioned in a respective tab, and
  a pair of set screws, the set screws being complementary to the orifices wherein each orifice is positioned for threadedly inserting a respective set screw such that the set screw extends through the respective tab and past the lower lip to frictionally couple to the lower crossmember such that the respective vertical member is coupled to the lower crossmember,
  each side bracket comprising:
  a pair of first arms pivotally coupled to and extending from a respective sidebar defining a first pivot point,
  a first axle rotationally coupled to and extending between the first arms distal from the respective sidebar defining a second pivot point,
  a second arm coupled to and extending from the first axle,
  a second axle coupled to the second arm distal from the first axle,
  a mounting plate rotationally coupled to the second axle defining a third pivot point, and
  a plurality of mounting holes positioned in the mounting plate wherein respective mounting holes are configured for selectively aligning with a set of four threaded holes positioned in a respective side display wherein each of the respective mounting holes is configured for inserting a bolt positioning the bolt for being threaded into a corresponding threaded hole for coupling the respective side display to the mounting plate wherein the first pivot point, the second pivot point, and the third pivot point are configured for allowing selective positioning of the respective side display relative to the respective sidebar and a front of the frame;
a pair of L-brackets, each L-bracket being coupled to a respective sidebar between the center bracket and an associated side bracket wherein the pair of L-brackets is configured for positioning a soundbar;
a rod coupled to and extending between the pair of sidebars, the rod being positioned on the sidebars between the pair of side brackets and the lower crossbar;
a plate coupled to and extending bidirectionally from the rod such that the plate is substantially parallel to the substantially horizontal surface wherein the plate is configured for positioning a component of a media system; and
a coaxial cable splitter comprising a coaxial cable input and a plurality of coaxial cable outputs coupled to the frame wherein the coaxial cable input is configured for coupling to a coaxial cable positioning the plurality of coaxial cable outputs for providing signal to the center display and the side displays, the plurality of coaxial cable outputs comprising three coaxial cable outputs.

\* \* \* \* \*